United States Patent [19]

Faraone

[11] Patent Number: 4,494,301
[45] Date of Patent: Jan. 22, 1985

[54] METHOD OF MAKING SEMICONDUCTOR DEVICE WITH MULTI-LEVELS OF POLYCRYSTALLINE SILICON CONDUCTORS

[75] Inventor: Lorenzo Faraone, Somerset, N.J.
[73] Assignee: RCA Corporation, New York, N.Y.
[21] Appl. No.: 528,451
[22] Filed: Sep. 1, 1983
[51] Int. Cl.³ .............................................. H01L 21/90
[52] U.S. Cl. ................... 29/571; 29/577 C; 29/578; 29/591; 357/59
[58] Field of Search ............... 29/571, 577 C, 578, 29/591; 357/59

[56] References Cited

U.S. PATENT DOCUMENTS

| | | | |
|---|---|---|---|
| 4,240,196 | 12/1980 | Jacobs et al. | 29/578 |
| 4,270,262 | 6/1981 | Hori et al. | 29/571 |
| 4,397,077 | 8/1983 | Derbenwick et al. | 29/571 |

FOREIGN PATENT DOCUMENTS 2085226  4/1982  United Kingdom .

Primary Examiner—Brian E. Hearn
Assistant Examiner—Alan E. Schiavelli
Attorney, Agent, or Firm—Birgit E. Morris; Donald S. Cohen

[57] ABSTRACT

A method of making a semiconductor device having multi-levels of polycrystalline silicon conductors insulated from each other and from the silicon substrate on which the semiconductor device if formed. In this method, each of the silicon oxide layers insulating the conductors from each other and from the substrate surface are each individually formed by thermal oxidation so that each is tailored in thickness and electrical characteristics for the particular purpose that each serves.

8 Claims, 5 Drawing Figures

METHOD OF MAKING SEMICONDUCTOR DEVICE WITH MULTI-LEVELS OF POLYCRYSTALLINE SILICON CONDUCTORS

BACKGROUND OF THE INVENTION

The present invention relates to a method of making a semiconductor device which has multi-levels of polycrystalline silicon (hereinafter referred to as "polysilicon") conductors with insulation between the conductors. More particularly, the present invention relates to such a method which allows for control of the thickness of the insulation between the outer conductor and both the inner conductor and the substrate.

In semiconductor integrated circuits, the trend has been to the use of conductive polysilicon for conductors, such as the gates of MOS field effect transistors and as interconnections between devices in the circuit. There are some types of integrated circuits, such as floating gate memory devices and charge coupled devices, which use multi-levels of such polysilicon conductors with insulation between the levels. In some of these types of integrated circuits, the second or outer level of the polysilicon overlaps and is insulated from a portion of the substrate as well as overlaps and is insulated from the first or inner level polysilicon. The insulation between the levels of the polysilicon and the substrate is generally thermally grown silicon oxide. It is well known that the thickness of the oxide thermally grown over a given time period on phosphorous doped polysilicon will be different from that grown on single crystalline silicon used as the substrate. Also, the thickness of the oxide grown over the edge of a defined area of polysilicon, such as the edge of a floating gate, will also be different. In addition, the insulating properties of silicon oxide thermally grown from polysilicon are inferior to those of silicon oxide grown from single crystalline silicon. In particular, oxides grown from polysilicon have a lower dielectric strength and exhibit enhanced Fowler-Nordheim tunneling current for a given applied electrical field. These properties are further degraded by the presence of crossover points where the outer polysilicon layer overlaps an edge or sidewall of the inner polysilicon layer. Therefore, it is desirable to have a method of making a semiconductor device having multi-levels of polysilicon conductors which permit tailoring the thicknesses of the oxides between the outer level and each of the inner level and the substrate to achieve desired electrical characteristics.

SUMMARY OF THE INVENTION

A method of making a semiconductor device having multi-levels of polycrystalline silicon conductors includes the steps of forming on the surface of a substrate of single crystalline silicon in sequence, a first layer of silicon oxide, a first layer of polycrystalline silicon on the first silicon oxide layer, a second layer of silicon oxide on the first polycrystalline silicon layer, and an oxidation resistant masking layer on the second silicon oxide layer. Portions of the masking layer, first silicon oxide layer and first polycrystalline silicon layer are then removed to define the first polycrystalline silicon layer and provide it with at least one exposed side wall. The device is then subjected to heat and oxygen to thermally grow a silicon oxide layer over the exposed side wall of the defined first polycrystalline silicon layer. A third layer of silicon oxide of a desired thickness is then provided on a portion of the surface of the substrate adjacent the side wall of the first polycrystalline silicon layer. A second layer of polycrystalline silicon is then formed on the second silicon oxide layer to overlap the first polycrystalline silicon layer; on the silicon oxide layer over the side wall of the first polycrystalline silicon layer; and over the third silicon oxide layer to overlap a portion of the surface of the substrate.

DETAILED DESCRIPTION OF PREFERRED EMBODIMENT

Figure 1:
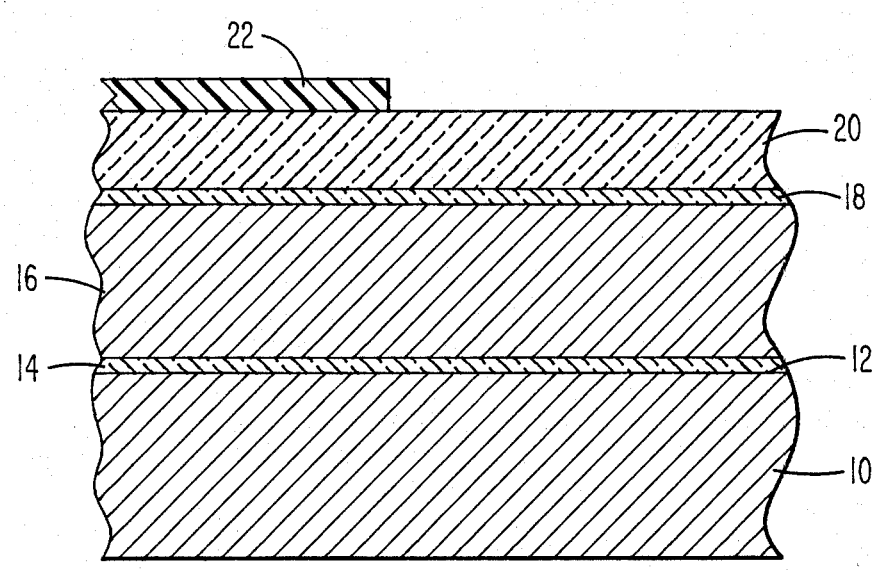
FIGS. 1–5 are sectional views of a portion of a semiconductor device illustrating the steps of the method of the present invention.

Referring initially to FIG. 1, the method of the present invention for making a semiconductor device starts with a substrate 10 of single crystalline silicon having a flat surface 12. The substrate 10 may include therein regions of different conductivity type, not shown, which form the elements of the circuit being formed. A first insulating layer 14 of silicon oxide is formed on the surface 12 of the substrate 10. The first silicon oxide layer 14 can be formed by subjecting the substrate surface 12 to an atmosphere of oxygen and/or water vapor at a temperature of about 800° C. to oxidize the surface of the substrate 12.

A layer 16 of polysilicon is then formed on the first silicon oxide layer 14. This is preferably achieved by depositing a layer of amorphous silicon on the silicon oxide layer 14 and annealing the amorphous layer to convert it to polycrystalline silicon. The amorphous silicon layer can be formed by placing the substrate 10 in a chamber and passing silane through the chamber at a pressure of approximately 500 millitorr and heating the substrate 10 to a temperature of about 560° C. The amorphous silicon layer is then doped with phosphorous by passing POCl₃ through the chamber at 950° C. for about 15 minutes. The POCl₃ decomposes to form phosphorous which diffuses into the amorphous silicon layer. At the same time, the amorphous silicon layer is converted to polycrystalline silicon. Forming the polysilicon layer 16 from amorphous silicon is preferred since the deposited amorphous silicon layer has a smooth surface which it retains when converted to polycrystalline silicon whereas the surface of a directly deposited polycrystalline silicon layer will be rough.

A second insulating layer 18 of silicon oxide is formed on the first polysilicon layer 16. This is achieved by heating the polysilicon layer 16 at 800° C. in an atmosphere of oxygen and steam to oxidize the surface of the polysilicon layer 16.

An oxidation resistant masking layer 20, such as of silicon nitride, is then formed on the second silicon oxide layer 18. This can be achieved by placing the substrate 10 in a chamber and passing silane and ammonia through the chamber at a temperature of about 800° C. The silane and ammonia react to form silicon nitride which is deposited on the second silicon oxide layer 18. The masking layer 20 is coated with a layer 22 of a resist material which is defined, using standard photolithographic techniques, to form portions which extend over the area of the polysilicon layer 16 which will form the first-level of conductors.

Figure 2:
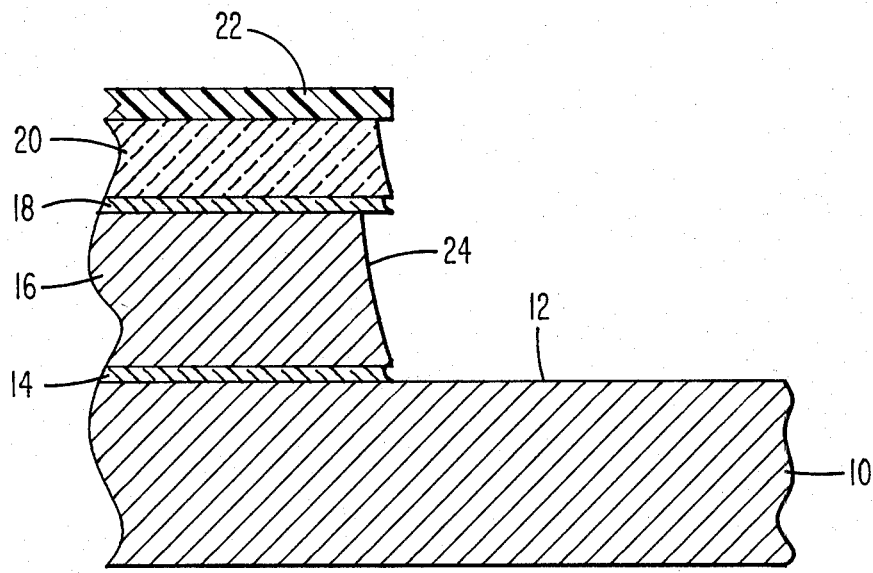

As shown in FIG. 2, the uncovered portions of the masking layer 20, second silicon oxide layer 18, first polysilicon layer 16 and first silicon oxide layer 14 are then removed in sequence using a suitable etchant for each of the materials. The silicon nitride masking layer 20 can be plasma etched, the oxide layers 18 and 14 can be either plasma etched or etched with buffered hydrofluoric acid, and the polysilicon layer 16 can plasma etched. Although the first silicon oxide layer 14 has been shown to be removed, it is not necessary that it be removed at this time but can be left covering the entire surface of the substrate 10. The polysilicon layer 16 as now defined has at least one exposed side wall 24.

Figure 3:
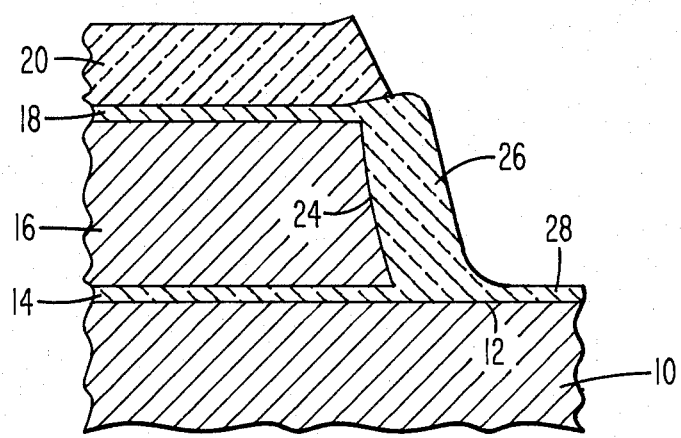

The semiconductor device is now again heated at 800° C. in an atmosphere of oxygen and steam to oxidize the side wall 24 of the polysilicon layer 16 and thus provide a relatively thick silicon oxide layer 26 over the side edge 24 as shown in FIG. 3. Simultaneously with the growth of the silicon oxide layer 26 over the side edge 24 of the first polysilicon layer 16, a layer 28 of silicon oxide is grown on the exposed portion of the substrate surface 12. However, because of the difference in the growth rates of silicon oxide on single crystalline silicon and phosphorous doped polycrystalline silicon, the silicon oxide layer 28 on the substrate 10 will be much thinner than the silicon oxide layer 26 on the sidewall 24. Although the silicon nitride masking layer 20 protects the second silicon oxide layer 18 during the growth of the silicon oxide layer 26, the silicon oxide layer 26 will bulge out from beyond the edge of the masking layer 20 as shown in FIG. 3. If the first silicon oxide layer 14 had not been removed from the substrate surface 12 when the polysilicon layer 16 was defined, the silicon oxide layer 28 will include the first silicon oxide layer 14 with additional thickness formed during the growth of the silicon oxide layer 26.

Figure 4:
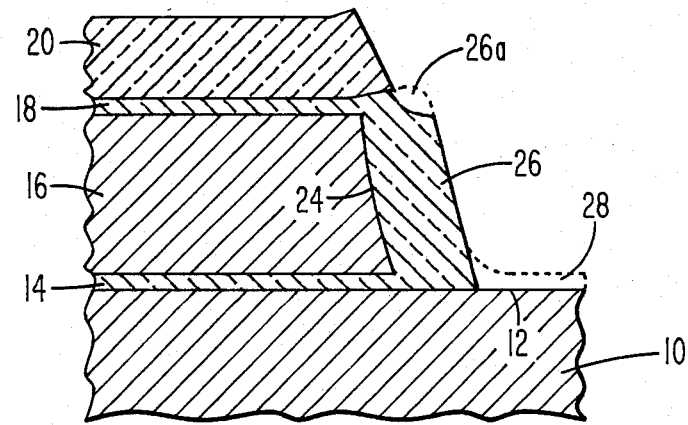

The silicon oxide layer 28 over the substrate surface 12 is now removed using an etching technique which etches in a direction perpendicular to the substrate surface 12, such as by plasma etching. This removes the silicon oxide layer 28 without substantially affecting the thickness of the silicon oxide layer 26 over the sidewall 24 of the first polysilicon layer 16. However, as shown in FIG. 4, the top portion 26a of the silicon oxide layer 26 which bulges out beyond the masking layer 20 will be removed to a depth equal to the thickness of the silicon oxide layer 28. A third insulating layer 30 of the desired thickness is now formed on the substrate surface 12 by subjecting the substrate surface 12 to an atmosphere of oxygen and water vapor at a temperature of about 800° C. to oxidize the surface 12 and form the insulating layer 30 of silicon oxide. During the growth of the third insulating layer 30, the silicon oxide layer 26 will be made slightly thicker. If the oxidation resistant masking layer 20 is removed prior to forming the third insulating layer 30, the second insulating layer 18 will also be made slightly thicker during the formation of the third insulating layer 30. However, if the masking layer 20 has not been removed, it is now removed using a suitable etchant.

Figure 5:
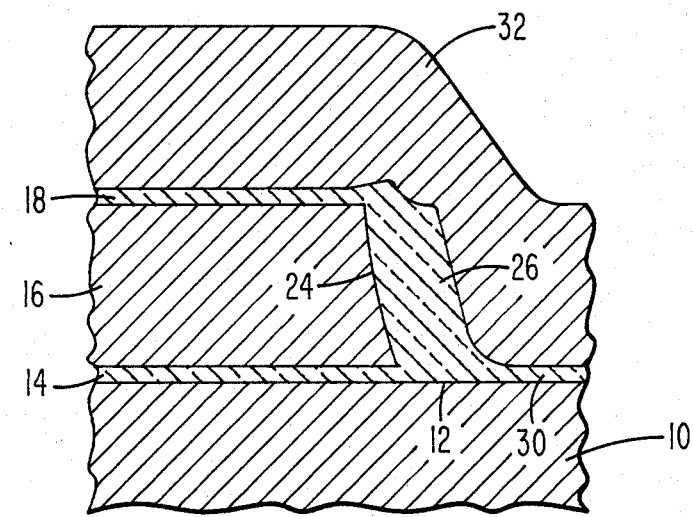

As shown in FIG. 5, a second polysilicon layer 32 is then deposited on the second insulating layer 18, the silicon oxide layer 26 and the third insulating layer 30. The second polysilicon layer 32 can be deposited directly as polycrystalline silicon or, as previously described with regard to the first polysilicon layer 16, can be deposited as amorphous silicon and converted to polycrystalline silicon when doped with phosphorous. Thus, the second polysilicon layer 32 overlaps and is insulated from the top surface of the first polysilicon layer 16, the edge 24 of the first polysilicon layer 16 and the surface 12 of the substrate 10. The second polysilicon layer 32 can be defined, using standard photolithographic techniques, to form the second-level conductors.

In the semiconductor device formed by the method of the present invention, the first and third silicon oxide layers 14 and 30 are grown on single crystalline silicon, the second silicon oxide layer 18 is grown over the top surface of a polysilicon layer 16 and the silicon oxide layer 26 is grown over the edge 24 of a polysilicon layer 16. Thus, as previously stated, for a given growing temperature and time, the thickness of each of these silicon oxide layers could be different and the electrical characteristics of the resultant oxide layers would therefore be different. Also, the desired electrical characteristics, and thus the thickness, of each silicon oxide layer would depend on its particular function. For example, the desired electrical characteristics of a silicon oxide layer used as a gate oxide between a gate and channel of an MOS field effect transistor may be different from that of a silicon oxide layer used as the insulation between a floating gate and a control gate or that of a silicon oxide layer used as insulation between the crossover point between two conductors. However, in the method of the present invention, the first silicon oxide layer 14, the second silicon oxide layer 18, the oxide layer 26 over the edge 24 of the first polysilicon layer 16 and the third silicon oxide layer 30 are each formed during a separate operation. Thus, the thickness and the electrical characteristics of each of the silicon oxide layers can be individually tailored to those desired for the particular use of the layer. Therefore, there is provided by the present invention a method of making a semiconductor device having multi-levels of polysilicon over a substrate of single crystalline silicon wherein the insulating layers between the various levels of the polysilicon and the substrate can be tailored to have the desired electrical characteristics.

I claim:

1. A method of making a semiconductor device having multi-levels of polycrystalline silicon conductors comprising the steps of
   (a) forming on the surface of a substrate of single crystalline silicon a first layer of silicon oxide,
   (b) forming on said first silicon oxide layer a first layer of polycrystalline silicon,
   (c) forming on said first polycrystalline silicon layer a second layer of silicon oxide,
   (d) forming on said second silicon oxide layer an oxidation resistant masking layer,
   (e) removing portions of said masking layer, second silicon oxide layer and first polycrystalline silicon layer to define the first polycrystalline silicon layer and provide it with at least one exposed side edge,
   (f) subjecting the device, with unremoved portions of said masking layer remaining over unremoved portions of said second silicon oxide layer, to heat and oxygen to thermally grow a silicon oxide layer over the exposed side edge of the defined first polycrystalline silicon layer,
   (g) separately from step (f) providing a third layer of silicon oxide of a desired thickness on a portion of said surface of the substrate adjacent said side edge of the first polycrystalline silicon layer, and
   (h) forming a second layer of polycrystalline silicon on the second silicon oxide layer to overlap the first polycrystalline silicon layer, on the silicon oxide layer over the side edge of the first polycrystalline silicon layer and over the third silicon oxide layer to overlap a portion of said surface of the substrate.

2. A method of making a semiconductor device in accordance with claim 1 in which in each of the silicon oxide layers are formed by heating the device in oxygen to grow the oxide on the silicon substrate or the polycrystalline silicon layer.

3. A method of making a semiconductor device in accordance with claim 2 wherein after step (f) but before step (g) the step of removing any silicon oxide on the portion of the surface of the substrate adjacent the said side edge of the first polycrystalline silicon layer.

4. A method of making a semiconductor device in accordance with claim 3 in which the silicon oxide on the portion of the surface of the substrate is removed by an etching process which etches in a direction substantially perpendicular to the surface of the substrate.

5. A method of making a semiconductor device in accordance with claim 4 in which the silicon oxide on the portion of the surface of the substrate is removed by plasma etching.

6. A method of making a semiconductor device in accordance with claim 5 in which during step (e) portions of the first silicon oxide layer are also removed to expose portions of the substrate surface and during step (f) a new layer of silicon oxide is grown on the exposed substrate surface simultaneously with the growing of the silicon oxide layer on the edge of the first polycrystalline silicon layer.

7. A method of making a semiconductor device in accordance with claim 1 in which after step (f) but before step (h) the masking layer is removed.

8. A method of making a semiconductor device in accordance with claim 7 in which the masking layer is formed by depositing a layer of silicon nitride on the second silicon oxide layer.

* * * * *